(12) United States Patent
Kim et al.

(10) Patent No.: US 7,625,615 B2
(45) Date of Patent: Dec. 1, 2009

(54) DONOR SUBSTRATE FOR FULL-COLOR ORGANIC ELECTROLUMINESCENT DISPLAY DEVICE, METHOD OF MANUFACTURING THE SAME, AND FULL-COLOR ORGANIC ELECTROLUMINESCENT DISPLAY DEVICE USING DONOR SUBSTRATE

(75) Inventors: Mu-Hyun Kim, Suwon-si (KR);
Tae-Min Kang, Suwon-si (KR);
Seong-Taek Lee, Suwon-si (KR);
Myung-Won Song, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 363 days.

(21) Appl. No.: 10/984,781

(22) Filed: Nov. 10, 2004

(65) Prior Publication Data

US 2005/0112303 A1    May 26, 2005

(30) Foreign Application Priority Data

Nov. 25, 2003    (KR) .................. 10-2003-0084243

(51) Int. Cl.
*B41M 5/00* (2006.01)
*H01J 1/62* (2006.01)
(52) U.S. Cl. .............. 428/32.6; 428/690; 428/917; 313/504; 313/506
(58) Field of Classification Search .......... 428/32.81, 428/690, 917, 292.1; 313/504, 506; 430/200
See application file for complete search history.

(56) References Cited

U.S. PATENT DOCUMENTS

| | | | |
|---|---|---|---|
| 5,220,348 A | 6/1993 | D'Aurelio | 347/236 |
| 5,256,506 A | 10/1993 | Ellis et al. | 430/201 |
| 5,278,023 A | 1/1994 | Bills et al. | 430/201 |
| 5,308,737 A | 5/1994 | Bills et al. | 430/201 |
| 5,688,551 A | 11/1997 | Littman et al. | 427/64 |
| 5,937,272 A | 8/1999 | Tang | 438/30 |
| 5,998,085 A | 12/1999 | Isberg et al. | 430/200 |

(Continued)

FOREIGN PATENT DOCUMENTS

JP    2002-270368    9/2002

(Continued)

OTHER PUBLICATIONS

Chinese Office Action corresponding to Chinese Patent Application No. 2004100962243, issued on Sep. 28, 2007.

(Continued)

*Primary Examiner*—D. Lawrence Tarazano
*Assistant Examiner*—Camie S Thompson
(74) *Attorney, Agent, or Firm*—Robert E. Bushnell, Esq.

(57) ABSTRACT

A donor substrate for a full-color organic electroluminescent display device includes: a base film; a light-to-heat conversion layer formed on the base film; and a transfer layer formed on the light-to-heat conversion layer. The transfer layer is an organic layer including a patterned organic electroluminescent material. Accordingly, it is possible to manufacture a high definition and large-sized organic electroluminescent display device in which misalignment does not occur upon forming an emission layer. The donor substrate and a full-color organic electroluminescent display device including the donor substrate are manufactured by methods according to the present invention.

24 Claims, 7 Drawing Sheets

U.S. PATENT DOCUMENTS

| | | | |
|---|---|---|---|
| 6,114,088 | A | 9/2000 | Wolk et al. ............... 430/273.1 |
| 6,214,520 | B1 | 4/2001 | Wolk et al. ............... 430/273.1 |
| 6,228,555 | B1 * | 5/2001 | Hoffend et al. ............ 430/200 |
| 6,485,884 | B2 * | 11/2002 | Wolk et al. .................. 430/200 |
| 2002/0149315 | A1 | 10/2002 | Blanchet-Fincher ......... 427/58 |
| 2005/0048316 | A1 * | 3/2005 | Kim et al. ................... 428/690 |
| 2005/0116241 | A1 * | 6/2005 | Yang et al. .................... 257/88 |

FOREIGN PATENT DOCUMENTS

| | | |
|---|---|---|
| JP | 2003-332053 | 11/2003 |
| KR | 10-1998-051814 | 9/1998 |
| KR | 2000-34508 | 6/2000 |

OTHER PUBLICATIONS

Japanese Office Action corresponding to Japanese Patent Application No. 2004-340300, issued on Dec. 4, 2007.

*Patent Registration Gazette* from the Korean Intellectual Property Office issued in Applicant's corresponding Korean Patent Application No. 10-2003-0084243 dated Aug. 9, 2006.

* cited by examiner

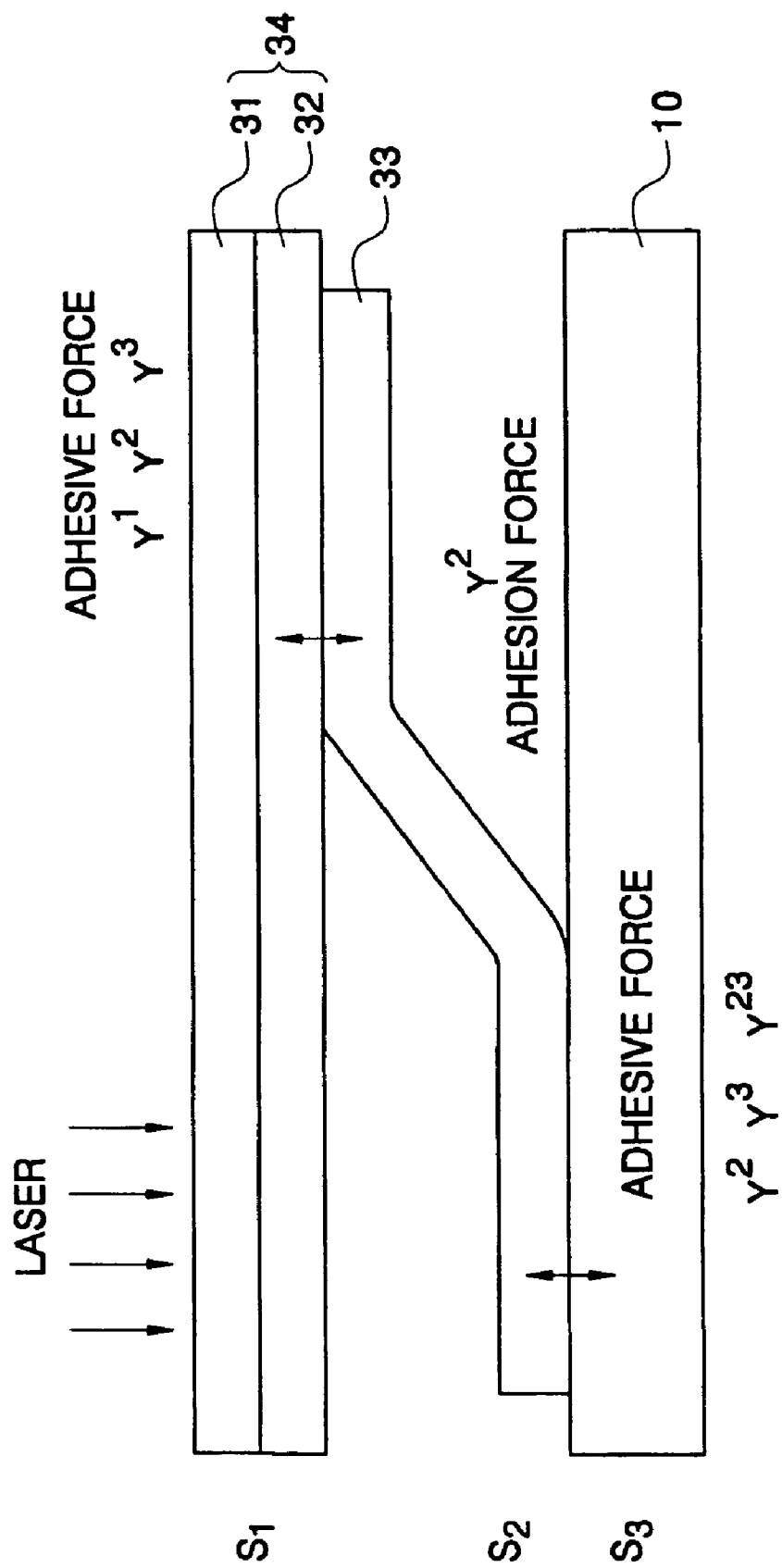

DONOR SUBSTRATE FOR FULL-COLOR ORGANIC ELECTROLUMINESCENT DISPLAY DEVICE, METHOD OF MANUFACTURING THE SAME, AND FULL-COLOR ORGANIC ELECTROLUMINESCENT DISPLAY DEVICE USING DONOR SUBSTRATE

CLAIM OF PRIORITY

This application makes reference to, incorporates the same herein, and claims all benefits accruing under 35 U.S.C. § 119 from an application entitled DONOR FILM FOR FULL COLOR ORGANIC ELECTROLUMINESCENT DISPLAY DEVICE, METHOD THEREOF, AND FULL COLOR ORGANIC ELECTROLUMINESCENT DISPLAY DEVICE USING THE SAME AS DONOR FILM filed with the Korean Intellectual Property Office on 25 Nov. 2003, and there duly assigned Serial No. 2003-84243.

BACKGROUND OF THE INVENTION

1. Technical Field

The present invention relates to a donor substrate for a full-color organic electroluminescent display device, a method of manufacturing the same, and a full-color organic electroluminescent display device using the donor substrate. More particularly, the present invention relates to a donor substrate for a full-color organic electroluminescent display device, a method of manufacturing the same, and a full-color organic electroluminescent display device using the donor substrate, in which a transfer donor substrate, which is used upon forming an emission layer for the full-color organic electroluminescent display device, is patterned such that misalignment does not occur upon forming the emission layer.

2. Related Art

Generally, an organic electroluminescent (EL) display device is composed of several layers, such as an anode, a cathode, a hole injecting layer, a hole transporting layer, an emission layer, an electron transporting layer, and an electron injecting layer. Organic electroluminescent display devices are classified into polymer organic electroluminescent display devices and small molecule organic electroluminescent display devices according to the material used therein. Typically, in the case of the small molecule organic electroluminescent display device, each of the layers is deposited by a vacuum deposition process, and in the case of the polymer organic EL device, the electroluminescent (EL) element is manufactured by a spin coating process.

For monochrome devices, an organic electroluminescent display device using a polymer may be simply manufactured by a spin coating process and needs a lower driving voltage compared to a device using the small molecules, but has the disadvantages of efficiency degradation and life span degradation. Furthermore, when manufacturing full color devices, polymers of red, green and blue colors have to be patterned, which degrades luminescence properties, such as efficiency and life span, when an inkjet technique or a laser induced thermal imaging process is used for the patterning.

In particular, when the laser induced thermal imaging process is used for patterning, a non-transferred material is primarily used as a single polymer material. A method of forming a pattern of a polymer organic electroluminescent display device using a laser induced thermal imaging process is disclosed in Korean Patent Application No. 1998-51844, and also in U.S. Pat. Nos. 5,998,085, 6,214,520 and 6,114,088.

The application of the laser induced thermal imaging process requires at least a light source, a transfer film, and a substrate, wherein light emitting from the light source is absorbed into a light absorption layer of a transfer layer and is converted to thermal energy, and wherein the thermal energy allows a material forming the transfer layer to be transferred onto the substrate, so that a desired image is formed (see U.S. Pat. Nos. 5,220,348, 5,256,506, 5,278,023 and 5,308,737).

This laser induced thermal imaging process has been used to manufacture a color filter for a liquid crystal display device, and has been also used to form a pattern of an electroluminescent material (see U.S. Pat. No. 5,998,085).

U.S. Pat. No. 5,937,272 discloses a method of forming an advanced patterned organic layer in a full-color organic electroluminescent display device. The method uses a donor support which is coated with a transferable coating material of an organic electroluminescent material. The donor support is heated to cause the organic electroluminescent material to be transferred onto a recessed surface of a substrate that forms a colored organic EL medium in intended sub-pixels. At this time, heat or light is applied to the donor substrate so that the electroluminescent material is vaporized and transferred to the pixel.

U.S. Pat. No. 5,688,551, a sub-pixel is formed in each pixel region by transfer from a donor sheet to a receiver sheet. In a transfer process, a sublimate organic electroluminescent material is transferred from the donor sheet to the receiver sheet at a low temperature (e.g., about 400° C. or less) to form the sub-pixel.

When the organic layer is a small molecule layer, the pattern is not clean, and when it is a polymer layer, the pattern is also not clean because the portion that must be transferred and patterned is left on the donor substrate when the interlayer adhesive strength is larger than the adhesive strengths.

SUMMARY OF THE INVENTION

The present invention solves the aforementioned problems associated with conventional devices by providing a transfer donor substrate, a method of manufacturing the same, and a full-color organic electroluminescent display device using the donor substrate in which, when an emission layer is formed, misalignment does not occur upon transferring an electroluminescent material, and the characteristic of the emission layer is not degraded because it is pre-patterned.

In an exemplary embodiment of the present invention, a donor substrate for a full-color organic electroluminescent display device includes: a base film; a light-to-heat conversion layer formed on the base film; and a transfer layer formed on the light-to-heat conversion layer. The transfer layer is an organic layer including a patterned organic electroluminescent material.

In another exemplary embodiment of the present invention, a method of manufacturing a donor substrate for a full-color organic electroluminescent display device includes: providing a base film; forming a light-to-heat conversion layer on the base film; and forming a patterned organic layer including an organic emission layer on the light-to-heat conversion layer using one of an inkjet method, a printing method, a lithography method, and an ablation method.

In yet another exemplary embodiment of the present invention, there is provided a method of manufacturing a full-color organic electroluminescent display device using the donor substrate, and a method of manufacturing a full-color organic electroluminescent display device in which an organic emission layer is formed by a laser thermal transfer method.

BRIEF DESCRIPTION OF THE DRAWINGS

The above and other features of the present invention will be described with reference to certain exemplary embodiments thereof and with reference to the attached drawings in which:

FIG. 1A is a view of a transfer mechanism upon transfer-patterning an organic emission layer for use in an organic electroluminescent display device using laser;

DETAILED DESCRIPTION OF THE INVENTION

Hereinafter, the present invention will be described in more detail.

FIG. 1A is a view of a transfer mechanism upon transfer-patterning an organic emission layer for use in an organic electroluminescent display device using laser.

Typically, as shown in FIG. 1A, the mechanism in transfer-patterning the organic layer using a laser requires that an organic layer S2, which is adhered to a substrate S1, be separated from the substrate S1 by the laser, and then be transferred onto a substrate S3, resulting in the separation of the organic layer S2 from a portion that is not irradiated by the laser.

Factors dominating transfer characteristics include a first adhesive force W12 between the substrate S1 and the layer S2, an interlayer adhesion force W22 between the layers, and a second adhesive strength W23 between the layer S2 and the substrate S3.

The following equation is obtained by representing the first and second adhesive forces and the interlayer adhesion force using surface tensions $\gamma 1$, $\gamma 2$ and $\gamma 3$ and interface tensions $\gamma 12$ and $\gamma 23$ of the respective layers:

$$W12 = \gamma 1 + \gamma 2 - \gamma 12$$

$$W22 = 2\gamma 2$$

$$W23 = \gamma 2 + \gamma 3 - \gamma 23$$

In order to enhance laser transfer characteristics, the interlayer adhesion force should be smaller than the adhesive forces between the substrates and the layers.

Generally, in the organic electroluminescent display device, an organic material is being used as a material forming each layer. In the case of using a small molecule material, it is possible to form a fine pattern of an emission layer by transferring an electroluminescent material from the donor substrate to the organic electroluminescent display device in order to cause a mass transition because the first and second adhesive forces are larger than the interlayer adhesion force.

Figure 1B:
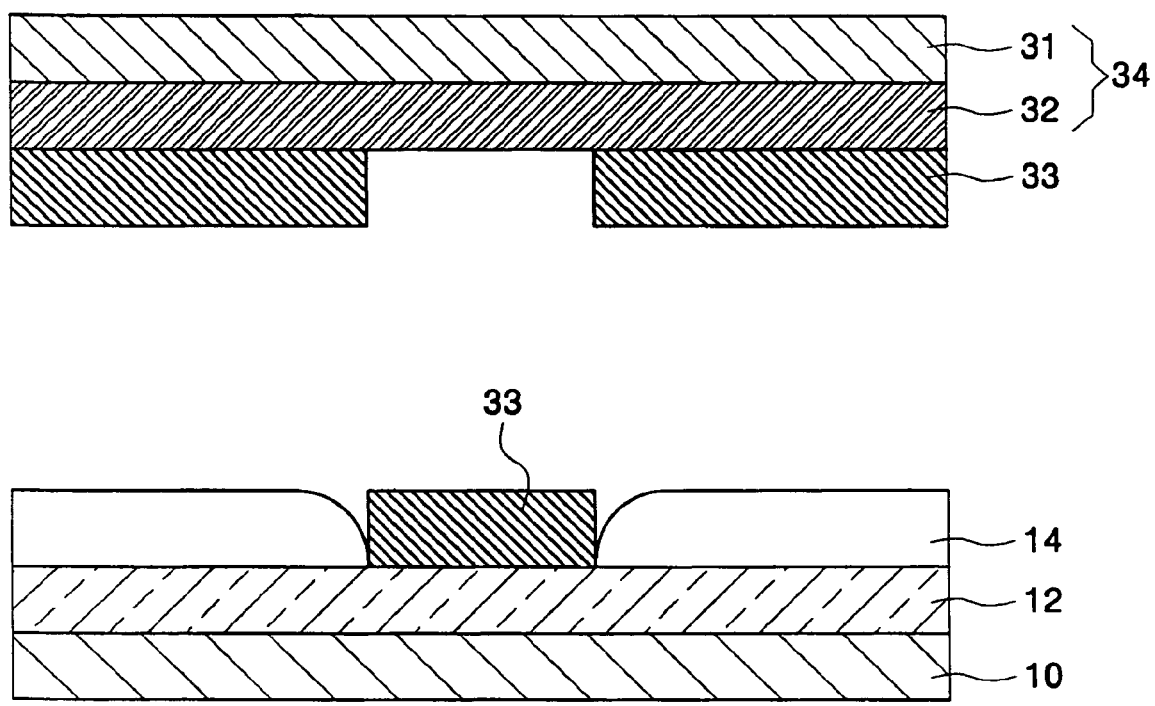
FIG. 1B is a cross-sectional view illustrating that an organic emission layer is transferred from a donor substrate onto a substrate according to the process of FIG. 1A.

FIG. 1B is a cross-sectional view illustrating that an organic emission layer is transferred from a donor substrate onto a substrate according to the process of FIG. 1A.

Referring to FIG. 1B, an organic layer in a portion irradiated by laser is transferred onto the substrate and a remaining portion of the organic layer is left on the donor substrate.

Figure 2A:
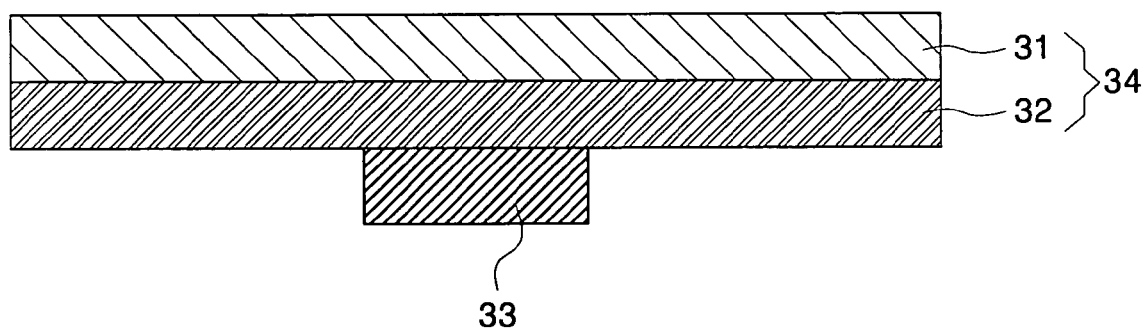
FIG. 2A is a cross-sectional view of the structure of a donor substrate for a full-color organic electroluminescent display device according to a first exemplary embodiment of the present invention.
Figure 2B:
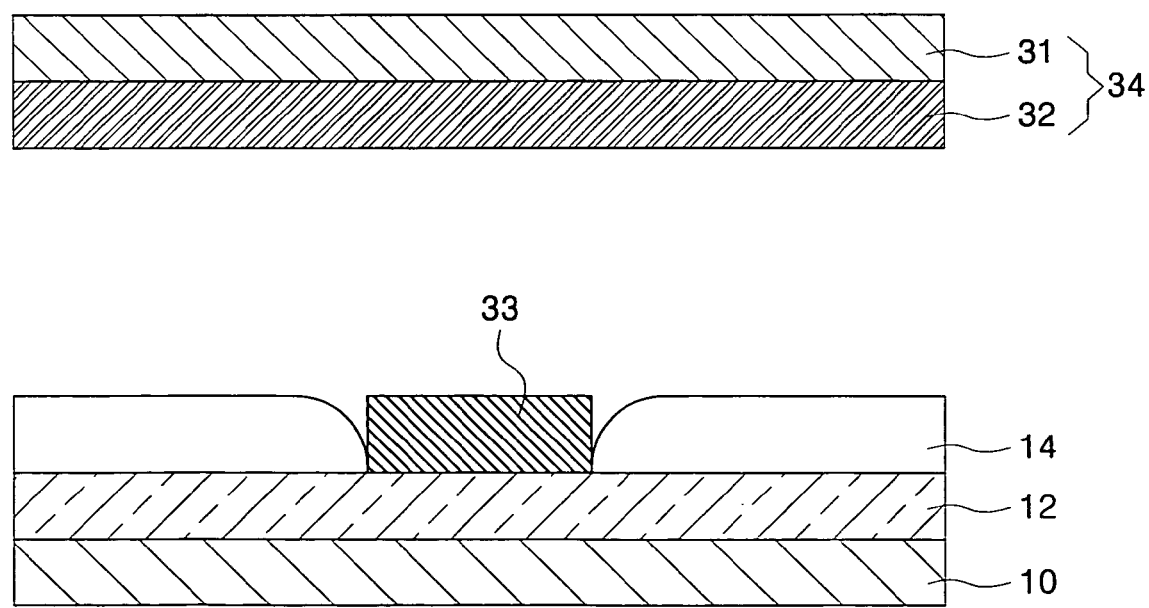
FIG. 2B is a cross-sectional view illustrating a result obtained after an organic layer is transferred from a donor substrate onto a substrate according to a second exemplary embodiment of the present invention.

FIG. 2A is a cross-sectional view of the structure of a donor substrate for a full-color organic electroluminescent display device according to a first exemplary embodiment of the present invention, and FIG. 2B is a cross-sectional view illustrating a result obtained after an organic layer is transferred from a donor substrate onto a substrate according to a second exemplary embodiment of the present invention.

Referring to FIG. 2A, a donor substrate 34 has a structure in which a light-to-heat conversion layer 32 and a transfer layer 33 are stacked on a base film 31.

In an exemplary embodiment of the present invention, the transfer layer 33, as shown in FIG. 2B, is in a patterned form and is composed of an organic layer including at least an organic electroluminescent material.

The organic layer further includes at least one organic layer selected from a group consisting of a hole injecting layer, a hole transporting layer, a hole blocking layer, an electron transporting layer, and an electron injecting layer. The organic electroluminescent material may be a polymer electroluminescent material, a small molecule electroluminescent material, or a mixture thereof.

FIG. 2A illustrates the most fundamental structure of the donor substrate 34. The structure maybe changed, if necessary. For example, an anti-reflection coating process maybe performed on the transfer layer 33 to prevent the properties of the transfer layer 33 from being degraded due to reflection. Further, a gas generating layer (not shown) may be formed beneath the light-to-heat conversion layer 32 to enhance the sensitivity of the donor substrate 34.

The gas generating layer serves to provide transfer energy by causing a decomposition reaction when absorbing light or heat, and by emitting nitrogen gas or hydrogen gas. The gas generating layer is formed of a material selected from pentaerythritol tetranitrate (PETN), trinitrotoluene (TNT), and the like.

The base film 31 is formed of a transparent polymer. For example, polyether such as polyethylene terephthalate, polyacryl, polyepoxy, polyethylene, or polystyrene is used as the polymer. In particular, polyethylene terephthalate layer is primarily used. It is preferable that the base film 31 have a thickness of 10 to 500 μm. This base film 31 serves as a supporting layer. A multiple system may be used as the base film 31.

The light-to-heat conversion layer 32 is formed of a light absorptive material having the ability to absorb light in the infrared or visible range. As a layer having such characteristics, a metal layer composed of aluminum, aluminum oxide and sulphide may be used. Alternatively, an organic layer composed of a polymer with carbon black, graphite or infrared dye may be used. When the light-to-heat conversion layer 32 is formed of a metal layer, the light-to-heat conversion layer 32 is formed to a thickness of 100 to 5,000 Å. When the light-to-heat conversion layer 32 is formed of an organic layer, the light-to-heat conversion layer 32 is formed to a thickness of 0.1 to 10 μm.

When the organic layer of the transfer layer 33 is transferred onto the substrate of the organic electroluminescent display device to form an organic emission layer, the transfer characteristic is determined only by the adhesive strength with the transfer substrate because there is no the adhesive strength with the organic layer constituting the transfer layer 33. Therefore, it can be seen that the transfer characteristic is excellent and better than that of a conventional arrangement.

Figure 3A:
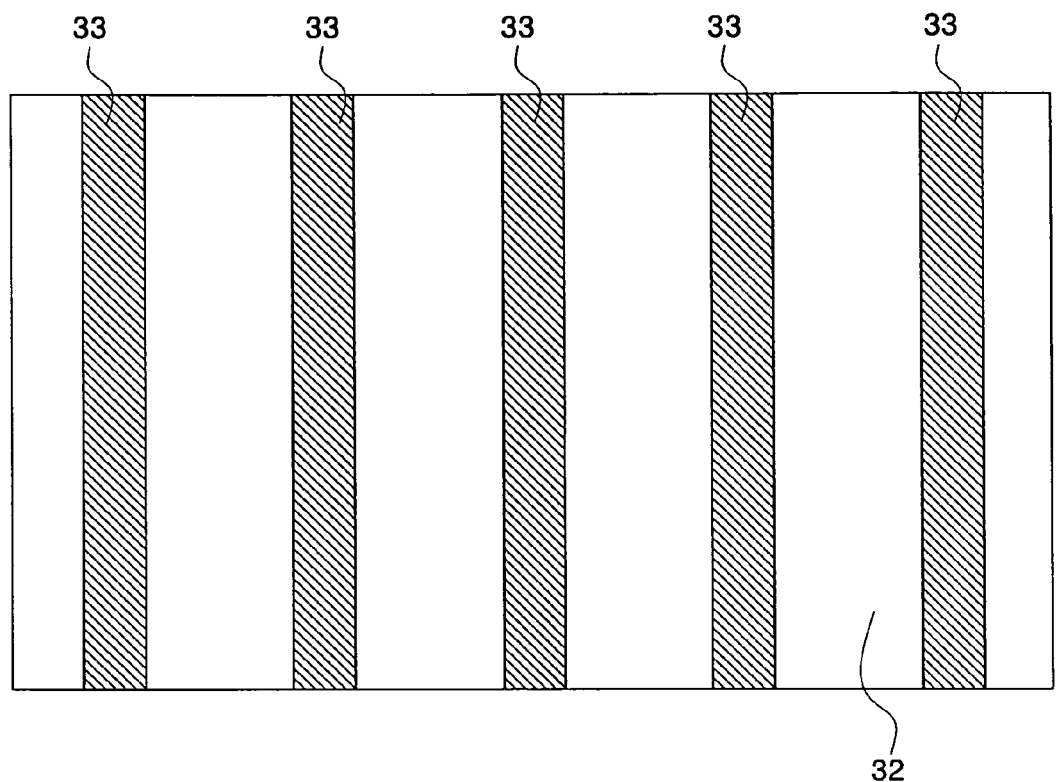
FIG. 3A is a plan view of the donor substrate for a full-color organic electroluminescent display device according to the first exemplary embodiment of the present invention.
Figure 3B:
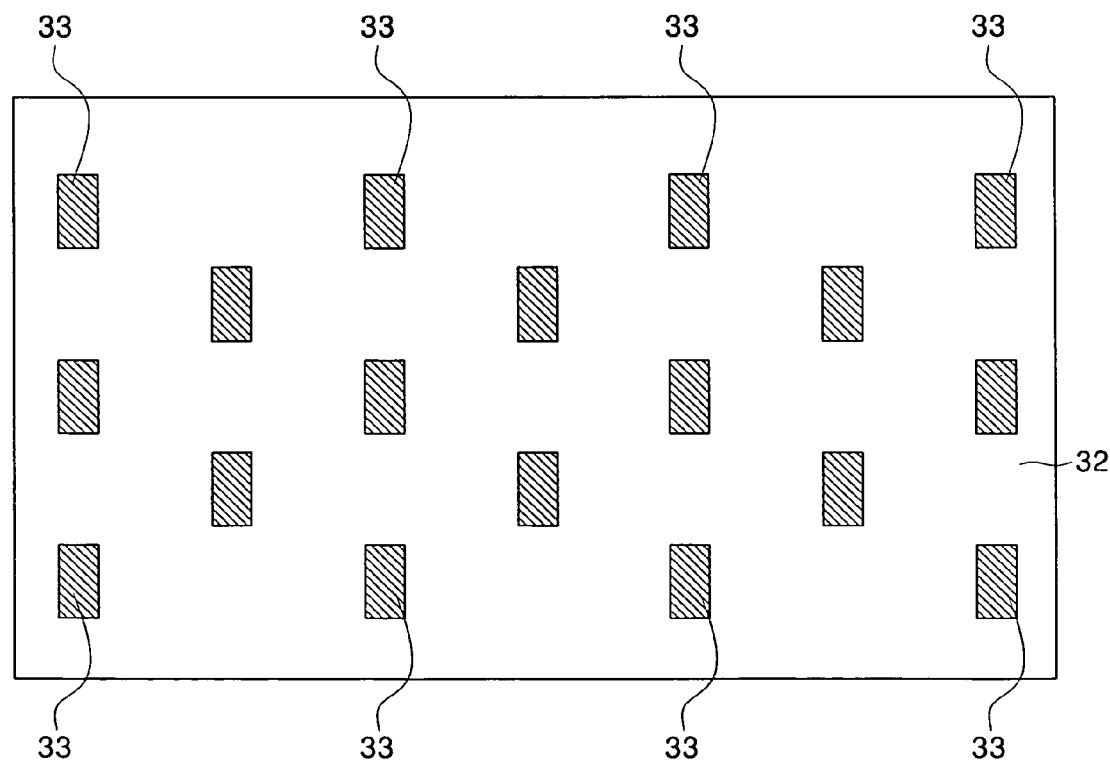
FIG. 3B is a plan view of a donor substrate for a full-color organic electroluminescent display device according to the second exemplary embodiment of the present invention.

FIG. 3A is a plan view of the donor substrate for a full-color organic electroluminescent display device according to the first exemplary embodiment of the present invention, and FIG. 3B is a plan view of a donor substrate for a full-color organic electroluminescent display device according to the second exemplary embodiment of the present invention.

The donor substrate 34 for the full-color organic electroluminescent display device of the present invention has a pattern shape varying according to the shape of a pixel region which is formed on the substrate of the organic electroluminescent display device.

Referring to FIG. 3A, when the pixel region of the organic electroluminescent display device has a stripe shape arranged in a matrix form, the pattern of the donor substrate 34 is formed in the stripe shape, as well. Accordingly, the transfer of the organic layer including the organic emission layer from the donor substrate 34 to the substrate of the organic electroluminescent display device makes alignment easier compared to the conventional transfer layer of the donor substrate having a non-patterned form. Therefore, misalignment is reduced. Also, it is possible to transfer only the emission layer without an added mixture.

Referring to FIG. 3B, when the pixel region of the organic electroluminescent display device has a delta shape, the pattern of the donor substrate 34 is formed in the delta shape as well.

Although the patterned structures of the transfer layer 33 with the stripe and delta shapes have been described in the present invention, they are only exemplary embodiments of the present invention and maybe changed depending on the pattern structure of the pixel region, which is formed on the substrate of the organic electroluminescent display device.

Hereinafter, a method of manufacturing a donor substrate having the structure of the present invention, and a method of manufacturing a full-color organic electroluminescent display device using the donor substrate, will be described.

Figure 4A:
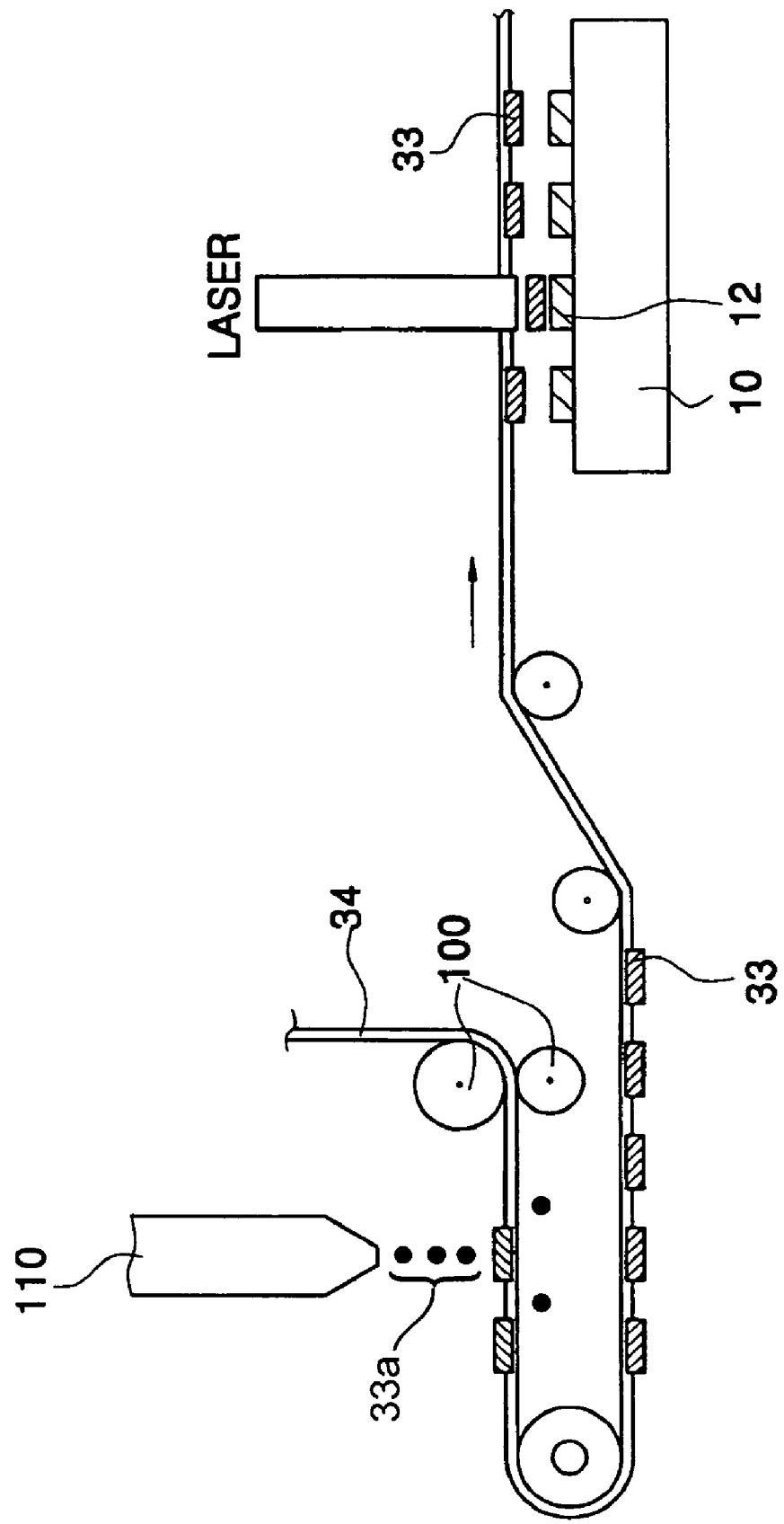
FIGS. 4A to 4C are views illustrating a method of manufacturing a donor substrate and a method of manufacturing a full-color organic electroluminescent display device using the donor substrate according to first to third exemplary embodiments of the present invention.
Figure 4B:
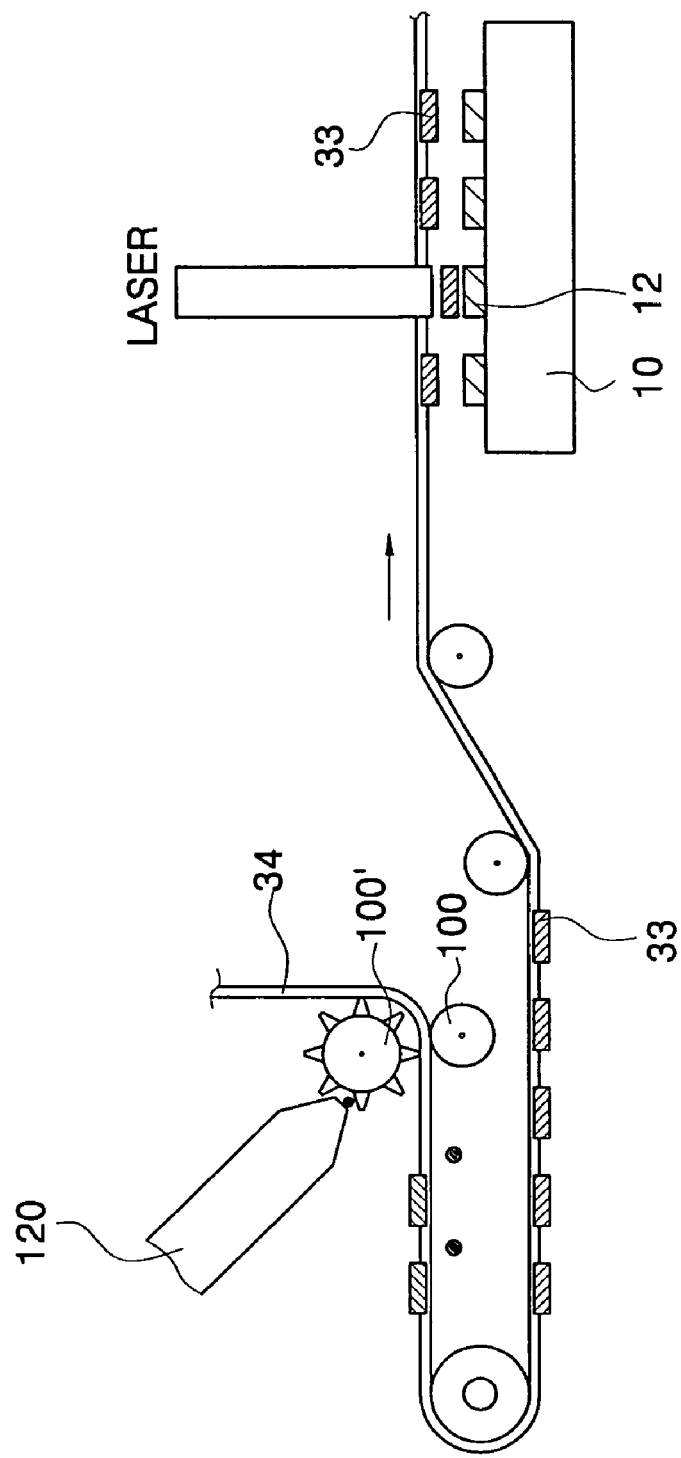
Figure 4C:
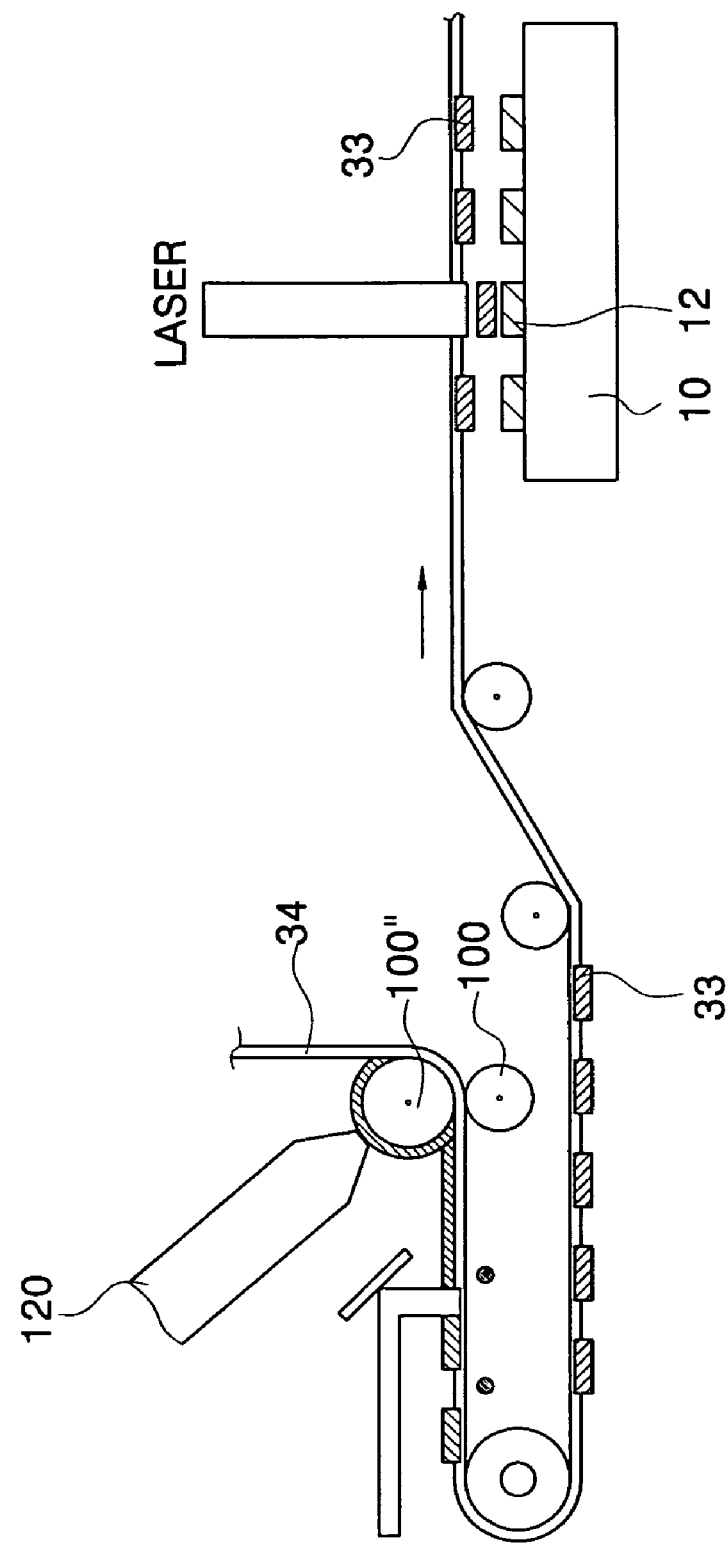

FIGS. 4A to 4C are views illustrating a method of manufacturing a donor substrate and a method of manufacturing a full-color organic electroluminescent display device using the donor substrate according to first to third exemplary embodiments of the present invention.

The first exemplary embodiment of the present invention will be described with reference to FIG. 4A. A donor substrate 34, in which a light-to-heat conversion layer 32 is formed on a base film 31, is successively supplied between rollers 100, and an organic material 33a is supplied by a supply tube 110 using an inkjet method so as to form a transfer layer 33 on the light-to-heat conversion layer 32, thereby forming the donor substrate 34. The light-to-heat conversion layer 32 may be formed of a metal layer or an organic layer as described above. When the light-to-heat conversion layer 32 is formed of the metal layer, the light-to-heat conversion layer 32 is formed to a thickness of 100 to 5,000Å using a vacuum deposition method, an electron beam deposition method or a sputtering method. When the light-to-heat conversion layer 32 is formed of the organic layer, the light-to-heat conversion layer 32 is formed to a thickness of 0.1 to 10 µm using an extrusion, spin, or knife coating method, which is a typical film coating method.

The transfer layer 33 further includes at least one organic layer selected from a group consisting of a hole injecting layer, a hole transporting layer, a hole blocking layer, an electron transporting layer, and an electron injecting layer. The organic electroluminescent material may be a polymer electroluminescent material, a small molecule electroluminescent material, or a mixture thereof.

Subsequent to completion of the rolling process, the donor substrate 34 is subjected to a process wherein an emission layer is formed in the pixel region of a full-color organic electroluminescent display device, a laser beam is irradiated onto a portion in which the transfer layer 33 of the donor substrate 34 has been formed, and the light-to-heat conversion layer 32 in the irradiated portion delivers heat to the transfer layer 33 such that the organic material of the organic layer forming the transfer layer 33 is transferred onto the pixel region, which is formed on the lower electrode 12 of the substrate 10.

In a subsequent process, an upper electrode 14 is formed on the transfer layer 33, and final encapsulation is performed such that the organic electroluminescent display device of the present invention is completed.

FIG. 4B illustrates a second exemplary embodiment of the present invention, which uses a supply tube 120 for supplying an organic material constituting the transfer layer 33 that is different from that in the first exemplary embodiment, and uses an upper roller 100' having a different shape from that of a lower roller 100. The upper roller 100' has grooves or protrusions formed thereon. The organic material supplied from the supply tube 120 is printed and patterned onto the donor substrate 34. The organic electroluminescent display device is completed using the same process as that in the first exemplary embodiment after the organic material has been formed, printed and patterned on the donor substrate 34.

As the printing method, for example, flat plate printing, convex plate printing, concave plate printing or gravure printing may be used depending on the structure of the rollers 100 and 100'.

FIG. 4C illustrates a third exemplary embodiment of the present invention, which is different from the first exemplary embodiment in that the method of patterning the transfer layer 33 is an ablation method using laser other than the inkjet method. After the organic material supplied by the supply tube 120 is first deposited on the donor substrate 34, which is positioned on an upper roller 100'', and is moved to a certain distance, the organic material is ablated and is patterned by the laser. The organic electroluminescent display device is completed using the same process as that in the first exemplary embodiment after the organic material has been printed and patterned on the donor substrate 34.

Although the exemplary embodiments of the present invention have been described in terms of a roller-to-roller method, it should be noted that a sheet-to-sheet method, a roller-to-sheet method, or a sheet-to-roller method may also be applied.

As described above, by using the transfer donor substrate according to the present invention, it is possible to manufacture a high definition and large-sized organic electroluminescent display device in which misalignment hardly occurs upon forming the emission layer for the full-color organic electroluminescent display device.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A donor substrate for a full-color organic electroluminescent display device, comprising:
  a base film;
  a light-to-heat conversion layer formed on the base film; and
  a transfer layer which comprises an organic layer including a patterned organic electroluminescent material formed on the light-to-heat conversion layer;

wherein the organic layer including the patterned organic electroluminescent material is transferred onto a pixel region of the organic electroluminescent device after patterning.

2. The donor substrate according to claim 1, wherein the organic layer is patterned in any one of a stripe shape and a delta shape.

3. The donor substrate according to claim 1, wherein the organic layer is selected from the group consisting of a hole injecting layer, a hole blocking layer, and an electron injecting layer.

4. The donor substrate according to claim 1, wherein the organic electroluminescent material is selected from the group consisting of a small molecule electroluminescent material, a polymer electroluminescent material, and a mixture thereof.

5. The donor substrate according to claim 1, wherein the light-to-heat conversion layer comprises a light absorptive material that absorbs light in at least one of an infrared range and a visible range.

6. A full-color organic electroluminescent display device which includes the donor substrate according to claim 1.

7. A method of manufacturing a full-color organic electroluminescent display device, comprising:
    providing a base film;
    forming a light-to-heat conversion layer on the base film;
    forming a patterned organic layer, including an organic emission layer, on the light-to-heat conversion layer; and
    transferring the patterned organic layer onto a pixel region of the full-color organic electroluminescent display device after patterning.

8. The method according to claim 7, wherein the step of forming the organic layer comprises using any one of a roll-to-roll method, a sheet-to-sheet method, and a sheet-to-roll method.

9. The method according to claim 7, wherein the step of patterning the organic layer comprises patterning in any one of a stripe shape and a delta shape.

10. The method according to claim 7, wherein the organic layer is selected from the group consisting of a hole injecting layer, a hole transporting layer, a hole blocking layer, an electron transporting layer, and an electron injecting layer.

11. The method according to claim 7, wherein the organic layer comprises an organic electroluminescent material which is selected from the group consisting of a small molecule electroluminescent material, a polymer electroluminescent material, and a mixture thereof.

12. A donor substrate for a full-color organic electroluminescent display device manufactured by the method according to claim 7.

13. A full-color organic electroluminescent device which includes a donor substrate manufactured by the method according to claim 7.

14. The method according to claim 7, wherein the step of forming the patterned organic layer comprises using one of an inkjet method, a printing method, a lithography method, and an ablation method.

15. The method according to claim 7, wherein the step of transferring the patterned organic layer onto the pixel region of the full-color organic electroluminescent device comprises using a laser induced thermal imaging process.

16. A method of manufacturing a full-color organic electroluminescent display device, comprising:
    providing a base film;
    forming a light-to-heat conversion layer on the base film;
    forming a patterned organic layer, including an organic emission layer, on the light-to-heat conversion layer; and
    transferring the patterned organic layer onto a pixel region of the full-color organic electroluminescent display device after patterning;
    wherein the organic layer is selected from the group consisting of a hole injecting layer, a hole blocking layer, and an electron injecting layer.

17. The method according to claim 16, wherein the step of forming the organic layer comprises using any one of a roll-to-roll method, a sheet-to-sheet method, a roll-to-sheet method, and a sheet-to-roll method.

18. The method according to claim 16, wherein the step of patterning the organic layer comprises patterning in any one of a stripe shape and a delta shape.

19. The method according to claim 16, wherein the organic layer comprises an organic electroluminescent material which is selected from the group consisting of a small molecule electroluminescent material, a polymer electroluminescent material, and a mixture thereof.

20. A full-color organic electroluminescent display device manufactured by the method according to claim 16.

21. The method according to claim 16, wherein the step of forming the patterned organic layer comprises using one of an inkjet method, a printing method, a lithography method, and an ablation method.

22. The method according to claim 16, wherein the step of transferring the patterned organic layer onto the pixel region of the full-color organic electroluminescent device comprises using a laser induced thermal imaging process.

23. A method of manufacturing a full-color organic electroluminescent display device, comprising:
    providing a base film;
    forming a light-to-heat conversion layer on the base film;
    forming a patterned organic layer, including an organic emission layer, on the light-to-heat conversion layer;
    transferring the patterned organic layer onto a pixel region of the full-color organic electroluminescent display device after patterning so as to form a transfer layer; and
    performing an anti-reflection coating process on the transfer layer to prevent properties of the transfer layer from being degraded due to reflection.

24. A method of manufacturing a full-color organic electroluminescent display device, comprising:
    providing a base film;
    forming a light-to-heat conversion layer on the base film;
    forming a patterned organic layer, including an organic emission layer, on the light-to-heat conversion layer;
    transferring the patterned organic layer onto a pixel region of the full-color organic electroluminescent display device after patterning so as to form a transfer layer; and
    forming a gas generating layer between the light-to-heat conversion layer and the transfer layer to enhance sensitivity of a donor substrate of the full-color organic electro luminescent display device.

* * * * *